Jan. 31, 1961 L. H. DÜLBERGER 2,970,280
TRANSISTOR OSCILLATOR
Filed Nov. 28, 1958
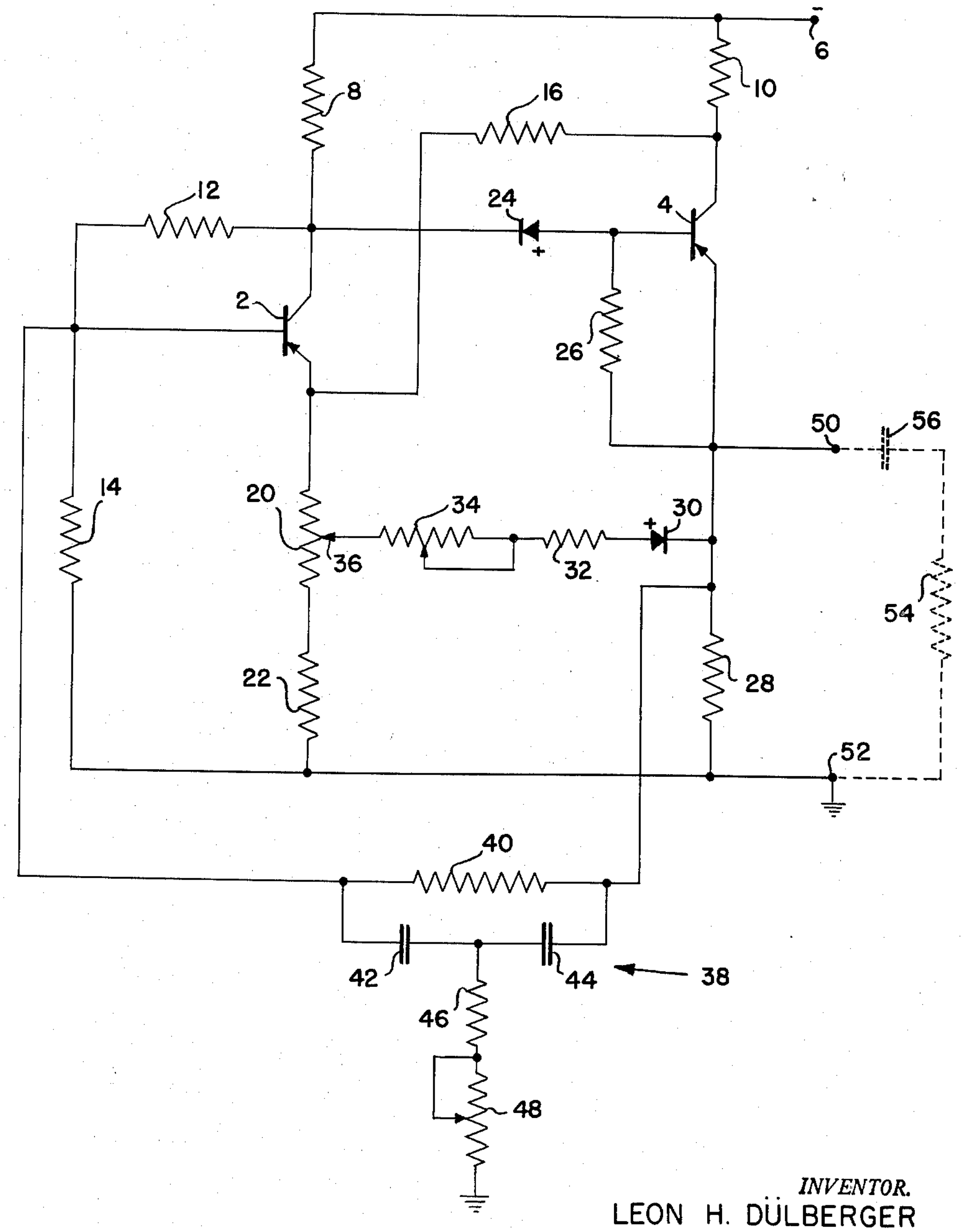
INVENTOR.
LEON H. DÜLBERGER
BY Bresser, Smith & Harding
ATTORNEYS 2,970,280

TRANSISTOR OSCILLATOR

Leon H. Dülberger, Holicong, Pa., assignor to Fischer & Porter Company, Hatboro, Pa., a corporation of Pennsylvania Filed Nov. 28, 1958, Ser. No. 777,081

4 Claims. (Cl. 331—110)

This invention relates to transistor oscillators and has particular reference to an oscillator for generating outputs with low harmonic content, having good frequency stability and good amplitude stability, and having a high degree of immunity to temperature variations and vibration or other shocks. In addition, the oscillator has a relatively high independence of operation with respect to load and is relatively immune from the standpoint of maintenance of characteristics to interchange of transistors.

Proposals have been made for transistor oscillators employing bridge T networks in negative feedback loops to achieve frequency stability. In such oscillators to secure amplitude control tungsten filament lamps have been employed utilizing the characteristic that in such a lamp its resistance increases with current therethrough. In such circuits electrolytic capacitors have been employed as direct current blocking elements in series with feedback loops and at low frequencies these have had to be of high capacity values. Because of the inclusion of the elements just mentioned the oscillators have been both bulky and subject to damage due to shock.

The general object of the present invention is to provide a type of oscillator having the desirable characteristics first referred to above without the employment of direct current blocking capacitors and without the use of filament lamps, while nevertheless securing stability against changes of temperature and the maintenance of proper operating direct current values for the transistors involved. As will become more apparent hereafter, the oscillator components may be quite small so that size of the complete oscillator is at a minimum.

The foregoing and other objects of the invention will become more apparent from the following description, read in conjunction with the accompanying drawing in which the figure shows a preferred oscillator circuit provided in accordance with the invention.

The oscillator employs two transistors 2 and 4 which are desirably of germanium type and consistently with the circuitry about to be described are PNP transistors. The choice of these transistors depends upon the frequency of operation. For frequencies up to 10 kilocycles per second 2N270 transistors have been employed; for frequencies in a higher range up to 100 kilocycles per second 2N247 transistors have been employed, these being particularly desirable, if the frequency permits, because of their high temperature stability; 2N384 transistors may be employed for frequencies up to about 350 kilocycles per second. As will become evident, other transistors may be used and those referred to have been cited merely for purposes of illustration. For purposes of illustration various values of components will be hereafter given such as have been found particularly applicable to an oscillator employing 2N247 transistors with frequencies ranging from 4 cycles per second to 100 kilocycles per second. Throughout this wide range of frequencies resistance values may remain the same, the frequency ranges being varied by the substitution of capacitors in a feedback network as hereafter pointed out.

A negative potential supply terminal is indicated at 6 and may have a voltage applied thereto, from a battery or other power supply, of approximately −20 volts with respect to ground. If a power supply is used it is desirably regulated for best stability conditions. The terminal 6 is connected to the collectors of the transistors 2 and 4, respectively, through the resistors 8 and 10 which typically may have values of 8.2 K ohms and 1 K ohm. A resistor 12 (27 K ohms) connects the collector and base of transistor 2, while the base of this transistor is connected through resistor 14 (56 K ohms) to ground.

A feedback connection is provided from the collector of transistor 4 to the emitter of transistor 2 through resistor 16 (8.2 K ohms). The emitter of transistor 2 is connected to ground through the series arrangement of resistance 20 (1 K ohms) of a potentiometer and a resistor 22 (3.3 K ohms). The base of transistor 4 is connected to the collector of transistor 2 through a silicon diode 24 (type SG–22) which is arranged with its anode connected to the base of transistor 4 and serves to maintain this base at a potential of approximately +0.6 volt above the collector of transistor 2 while offering a low alternating current impedance between these elements. The base of transistor 4 is connected through resistor 26 (680 ohms) to the emitter of this same transistor, and the emitter is connected to ground through resistor 28 (8.2 K ohms). A feedback connection between the emitter of transistor 4 and the adjustable contact 36 of potentiometer 20 is provided by the series arrangement of a silicon diode 30, fixed resistor 32 (560 ohms) and an adjustable resistor 34 (1 K ohms). The diode 30 may be of the same type as the diode 24 and has its cathode connected to the emitter of transistor 4. A potential drop of about 0.6 volt exists also across this diode while it offers a low impedance to alternating current signals.

Frequency control is afforded by the bridge T network indicated generally at 38 and comprising in its series arm the resistor 40 (15 K ohms) shunted by the series arrangement of capacitors 42 and 44, the junction between these being connected to ground through a fixed resistor 46 (2.5 K ohms) and an adjustable resistor 48 (1 K ohms). The frequency characteristics of this bridge T network are primarily established by the values chosen for the capacitors 42 and 44, adjustment of variable resistance 48 serving for fine adjustments of frequency. Typically, these capacities may have values ranging, for each, from about 6.8 microfarads for a frequency of 4 cycles per second to 200 micromicrofarads for a frequency of 100 kilocycles per second. The output terminals are indicated at 50 and 52, the latter being grounded. The load may comprise an impedance indicated at 54, and if direct current is to be blocked a series capacitor 56 may be provided, the value to be chosen in accordance with the frequency. For best operation, it has been found that the load impedance should be not less than 3,000 ohms. With values as heretofore given a no load peak to peak output voltage of about 5.4 volts has been obtained.

The use of the diodes maintaining fixed voltage drops as indicated above is particularly useful in eliminating direct current blocking capacitors and in biasing the circuit to maintain the proper operating points at the transistor terminals. At the same time low alternating current impedances exist.

Frequency is determined by the negative feedback through the bridge T network 38, minimum negative feedback existing at the frequency of the notch of the characteristic of this network so that oscillations are stabilized essentially at this notch frequency and quite independent of the characteristics of other elements of the circuit, particularly the transistors. Positive feedback is provided at all frequencies through the elements 30, 32, 34, 36 and 20, adjustments of the potentiometer contact 36 and of the value of resistance 34 being made for maximum output and acceptable distortion at the notch frequency for a particular chosen load impedance.

Negative direct current feedback is provided through resistor 16. This is to offset changes in the operating point of transistor 2 due to changes in ambient temperature affecting the feedback through the positive feedback loop 30, 32, 34. Direct current feedback is also developed across resistor 12. Both of the last mentioned feedbacks also provide alternating current feedback improving amplitude and frequency stability and reducing harmonic distortion.

As will be evident from the foregoing, a simple oscillator is provided which has the desirable characteristics set forth above. It will be evident that various changes may be made without departing from the invention as defined in the following claims.

What is claimed is:

1. An oscillator comprising a first transistor amplifying stage, a second transistor amplifying stage, a connection feeding amplified output signals from said first stage to the input of said second stage, a negative feedback connection from the second stage to the first stage, said feedback connection comprising a network having the property of substantially attenuating signals in the vicinity of only one frequency of a broad frequency range, and a positive feedback connection from the second stage to the first stage having the property of passing approximately uniformly signals of a broad frequency range including said one frequency, said positive feedback connection including a series diode providing a low alternating current impedance and providing a substantially constant direct potential between said stages.

2. An oscillator according to claim 1 including a second negative feedback connection from the second stage to the first stage including a series resistance and passing approximately uniformly signals of a broad frequency range including said one frequency.

3. An oscillator according to claim 1 in which the first mentioned connection includes a series diode providing a low alternating current impedance and providing a substantially constant direct potential between said stages.

4. An oscillator according to claim 2 in which the first mentioned connection includes a series diode providing a low alternating current impedance and providing a substantially constant direct potential between said stages.

References Cited in the file of this patent

UNITED STATES PATENTS

| | | |
|---|---|---|
| 2,568,868 | Pratt | Sept. 25, 1951 |
| 2,737,587 | Trousdale | Mar. 6, 1956 |
| 2,764,643 | Sulzer | Sept. 25, 1956 |